（12） United States Patent
Inanami et al.

(10) Patent No.: US 9,021,983 B2
(45) Date of Patent: May 5, 2015

(54) STAGE APPARATUS AND PROCESS APPARATUS

(75) Inventors: Ryoichi Inanami, Yokohama (JP); Shinichi Ito, Yokohama (JP); Hiroshi Koizumi, Hiratsuka (JP); Akihiro Kojima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 307 days.

(21) Appl. No.: 13/428,530

(22) Filed: Mar. 23, 2012

(65) Prior Publication Data

US 2013/0014360 A1 Jan. 17, 2013

(30) Foreign Application Priority Data

Jul. 14, 2011 (JP) ................................. 2011-156005

(51) Int. Cl.
| | |
|---|---|
| *B05C 11/00* | (2006.01) |
| *C23C 16/00* | (2006.01) |
| *H01L 21/76* | (2006.01) |
| *H01L 21/687* | (2006.01) |
| *H01L 21/67* | (2006.01) |
| *H01L 21/683* | (2006.01) |

(52) U.S. Cl.
CPC ........ *H01L 21/6875* (2013.01); *H01L 21/6715* (2013.01); *H01L 21/6838* (2013.01); *H01L 21/6833* (2013.01); *H01L 21/67288* (2013.01)

(58) Field of Classification Search
CPC ............ H01L 21/6715; H01L 21/6838; H01L 21/6833
USPC .................................. 118/663, 720; 438/401
See application file for complete search history.

(56) References Cited

U.S. PATENT DOCUMENTS

| 8,110,421 B2 | 2/2012 | Sugizaki et al. |
| 2007/0212488 A1* | 9/2007 | Murooka ....................... 427/256 |
| 2008/0214094 A1* | 9/2008 | Katoh et al. ..................... 451/41 |
| 2009/0068765 A1* | 3/2009 | Murooka .......................... 438/5 |
| 2011/0300644 A1 | 12/2011 | Akimoto et al. |

FOREIGN PATENT DOCUMENTS

| JP | 63-28035 | 2/1988 |
| JP | 2004-87943 | 3/2004 |
| JP | 2006-203075 | 8/2006 |
| JP | 2011-517090 | 5/2011 |

OTHER PUBLICATIONS

Office Action for corresponding Japanese Patent Application No. 2011-156005 mailed on Jun. 3, 2014 and English translation (5 pages).

* cited by examiner

*Primary Examiner* — Nicholas Tobergte
(74) *Attorney, Agent, or Firm* — Finnegan, Henderson, Farabow, Garrett & Dunner, LLP

(57) ABSTRACT

According to one embodiment, a stage apparatus includes a height control unit includes height control elements each which is drove in an upward/downward direction independently, a measuring unit which divides an upper surface of the substrate into areas, and measures a height of each of the areas. The control unit is configured to set the height of each of the areas independently by controlling a height of each of the height control elements based on a data value, determine using the measuring unit whether the height of each of the areas in the upper surface of the substrate is in a allowable range, and set the height of the area out of the allowable range again by the height control elements.

18 Claims, 15 Drawing Sheets

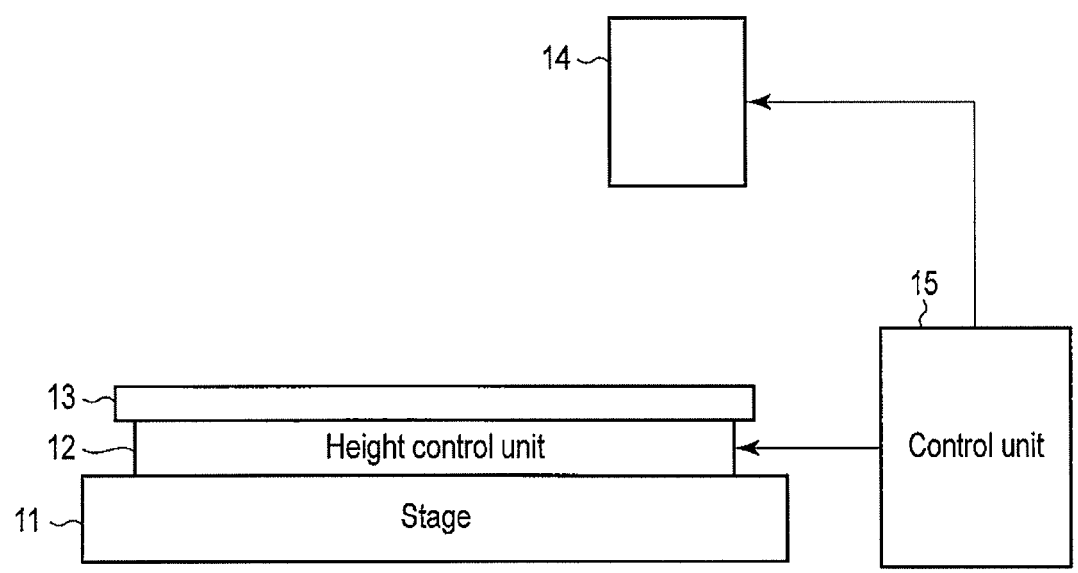
F I G. 1

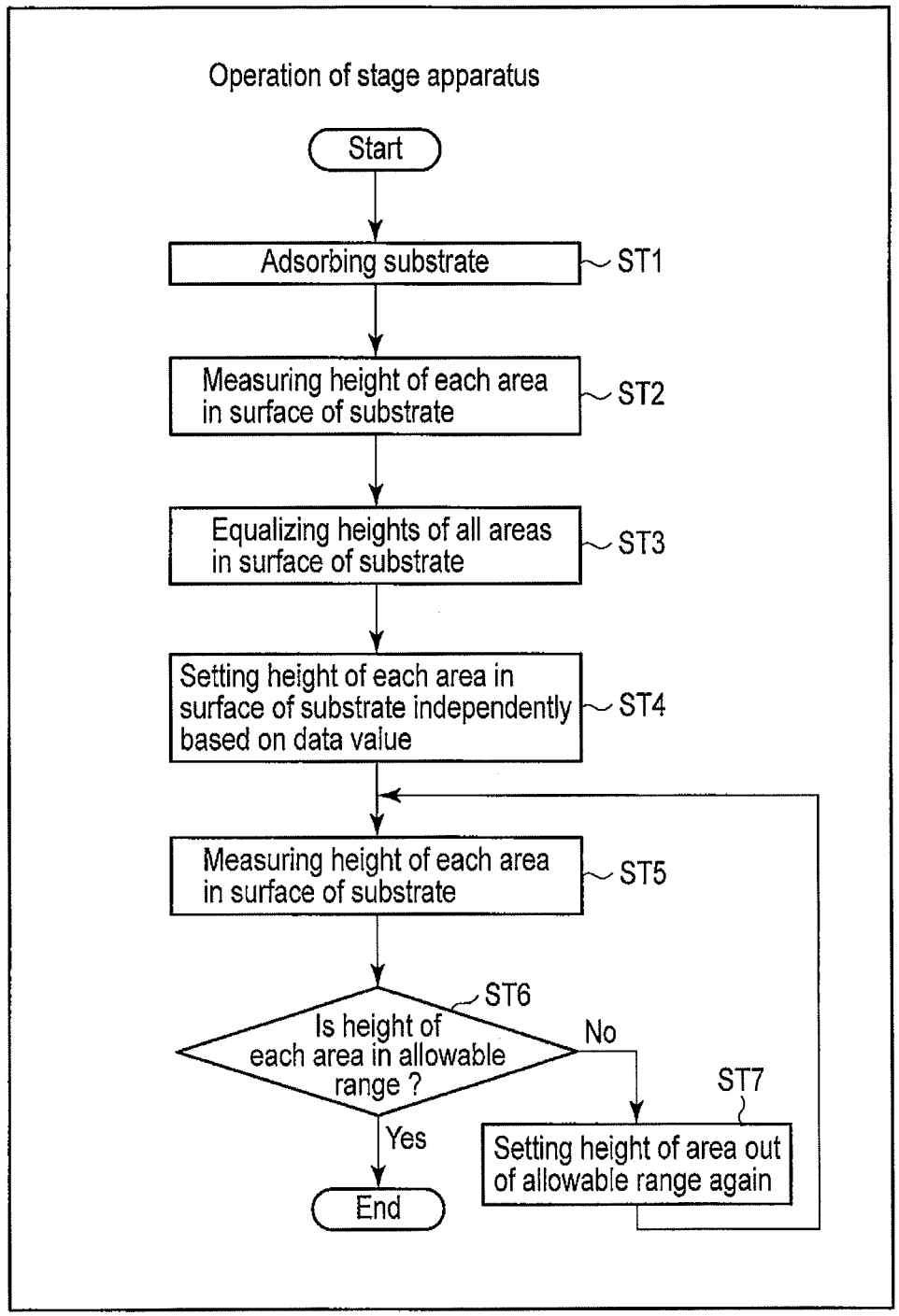
F I G. 8

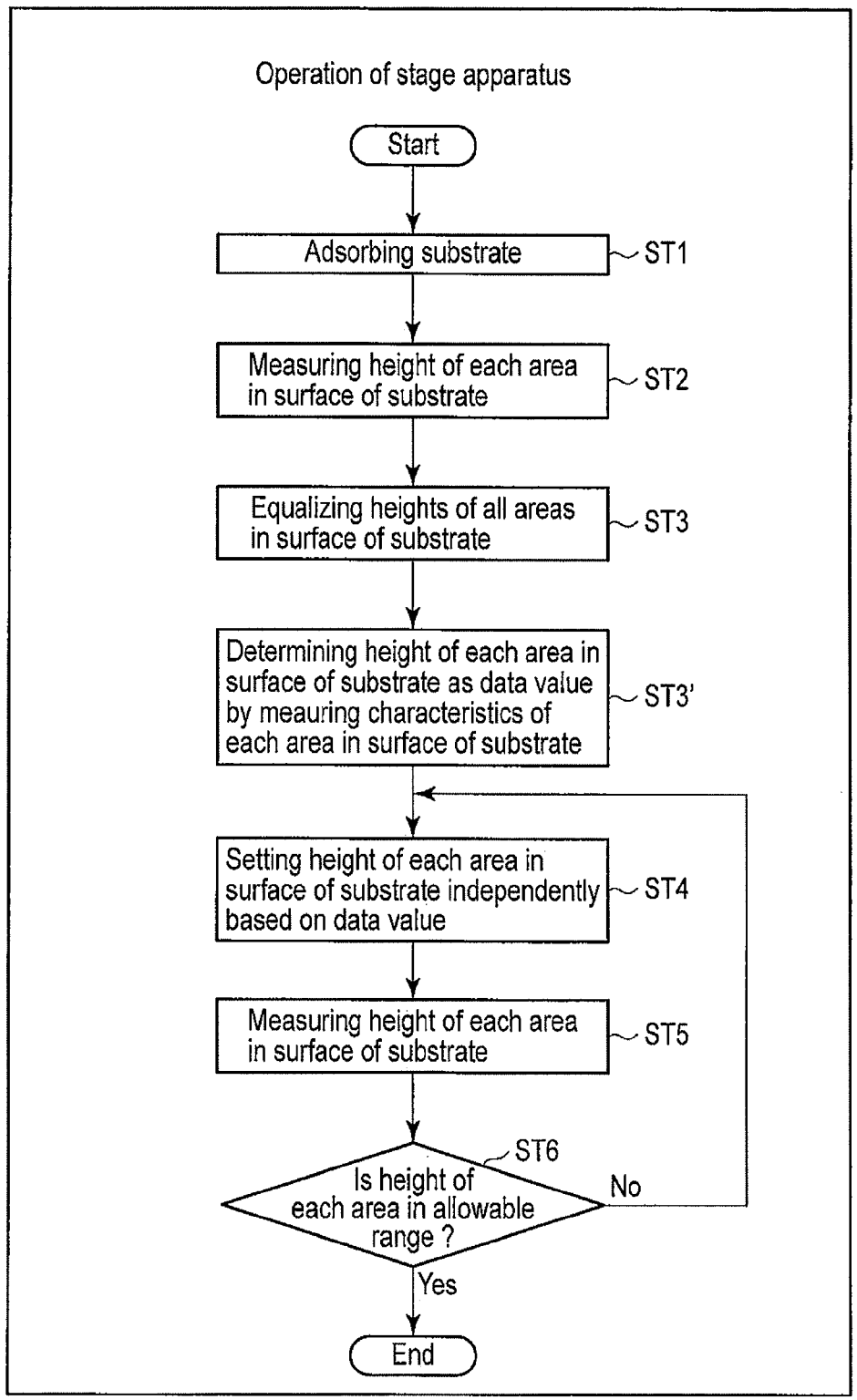
F I G. 9

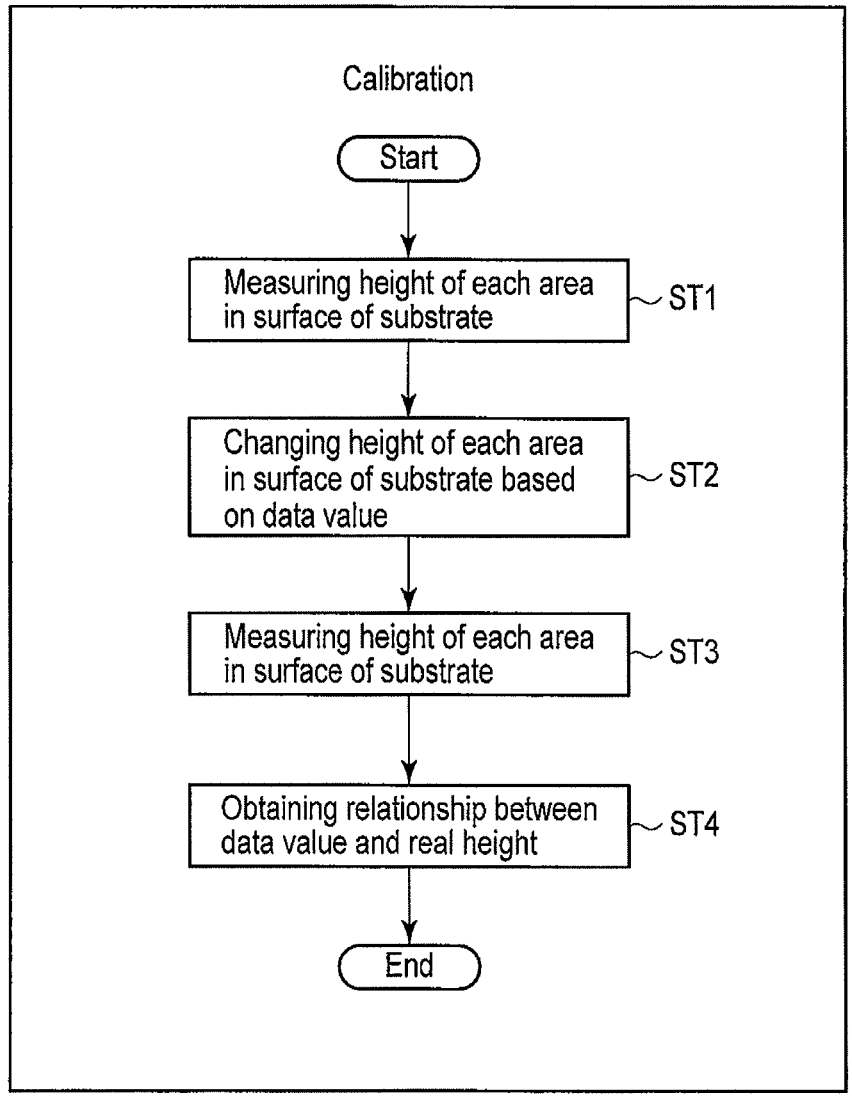
F I G. 10

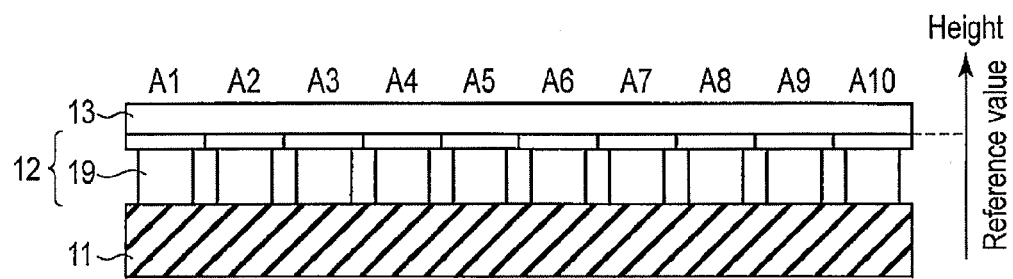
F I G. 1 2
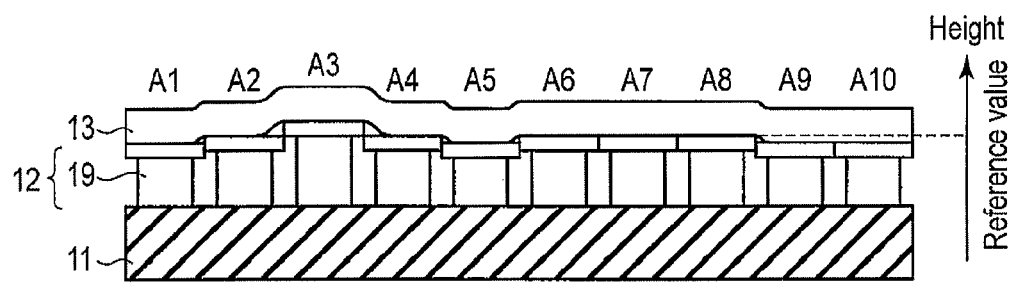
F I G. 1 3
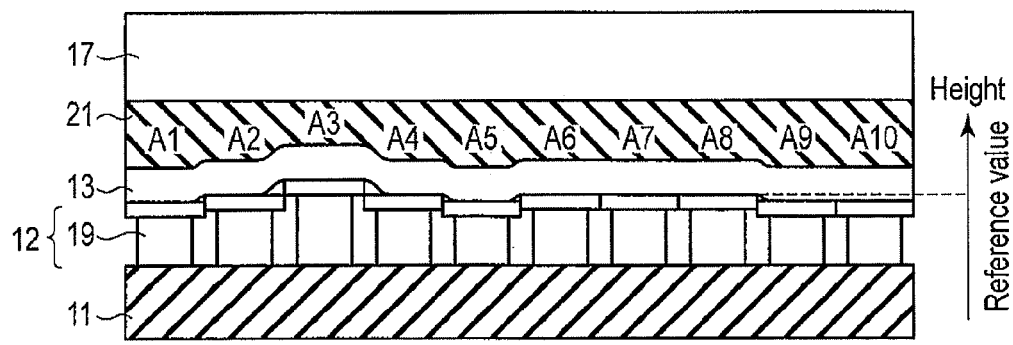
F I G. 1 4

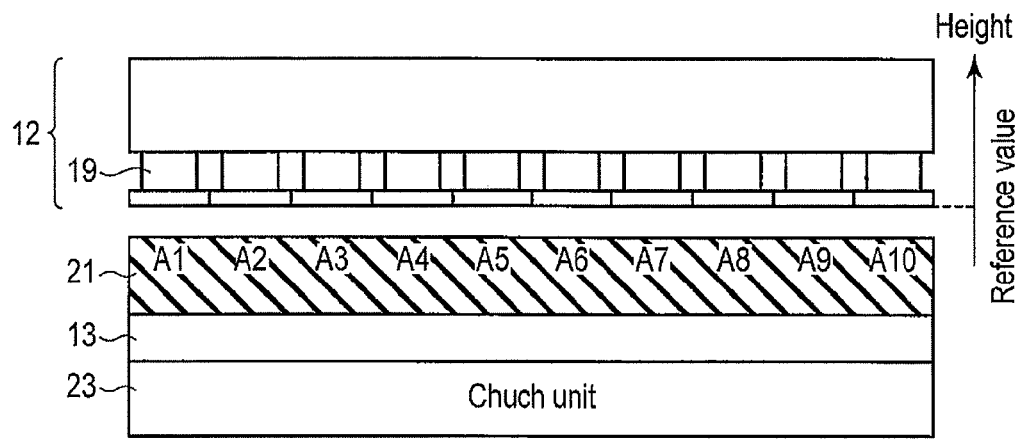
F I G. 17
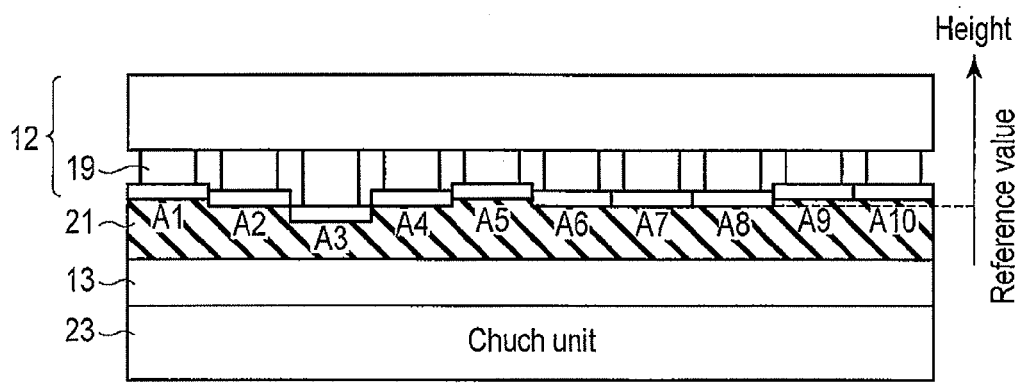
F I G. 18
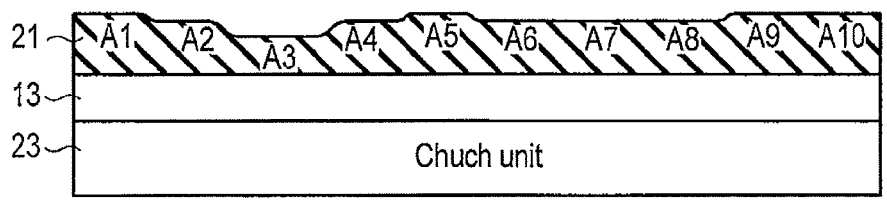
F I G. 19

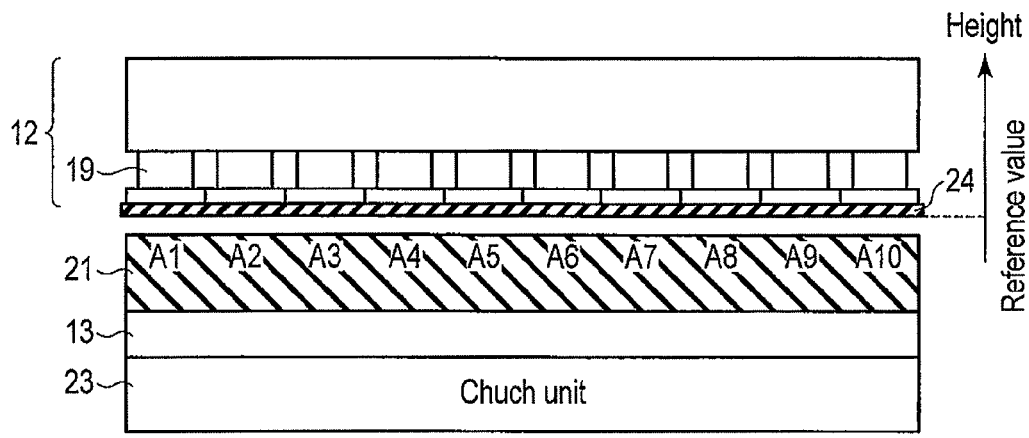
F I G. 2 0
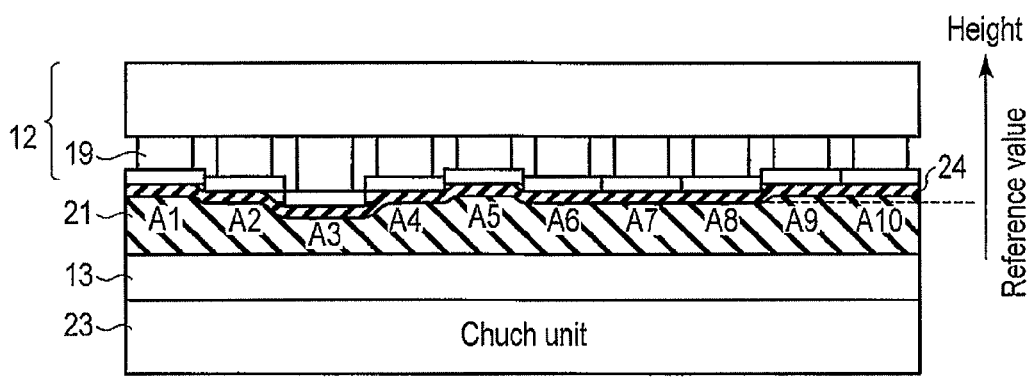
F I G. 2 1
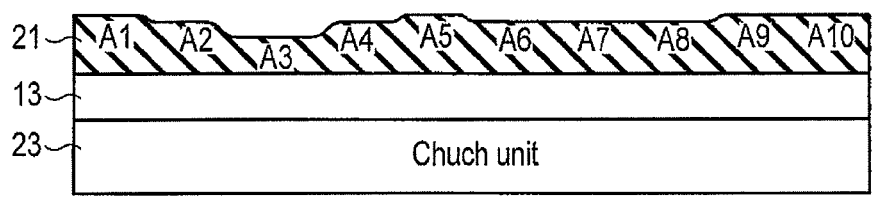
F I G. 2 2

STAGE APPARATUS AND PROCESS APPARATUS

CROSS-REFERENCE TO RELATED APPLICATIONS

This application is based upon and claims the benefit of priority from prior Japanese Patent Application No. 2011-156005, filed Jul. 14, 2011, the entire contents of which are incorporated herein by reference.

FIELD

Embodiments described herein relate generally to a stage apparatus and a process apparatus.

BACKGROUND

When electronic devices such as a semiconductor device, an organic device, an inorganic device, and the like are manufactured, there is a process which forms a function material layer. The function material layer is a material layer which is formed on a substrate and has a specific function and includes a conductor layer, an insulator layer, and a semiconductor layer which constitute a semiconductor device and a semiconductor layer, a charge transport layer, and an electrode layer which constitute a solar cell device.

In general, it is desirable to form the function material layer in a uniform thickness on a substrate. However, when a solar cell device, a light emitting diode (LED) device, a color filter of an image sensor, and the like are formed, it is necessary to change a thickness of the function material layer in a substrate surface in response to a substrate, and a material, characteristics, and the like on the function material layer, and the like and to provide the function material layer with a thickness distribution.

In conventional technologies, the thickness distribution is realized, first, by using an inkjet technology, a dispenser technology, and the like and, second, by forming a function material layer in a uniform thickness and thereafter partially cutting or polishing the function material layer.

However, these methods have a problem in that a controllability of a thickness of the function material layer is bad and a process time is long. Further, the latter method has a problem in that since a large amount of a valuable material is consumed by cutting or polishing, a material cost increases, and the like.

BRIEF DESCRIPTION OF THE DRAWINGS

FIG. 1 is a view showing a stage apparatus;
FIGS. 7 to 9 are flowcharts showing an operation of the stage apparatus;
FIG. 10 is a flowchart showing a calibration;
FIGS. 12 to 15 are views showing operations of the process apparatus;
FIGS. 17 to 22 are views showing operations of the process apparatus.

DETAILED DESCRIPTION

Figure 2:
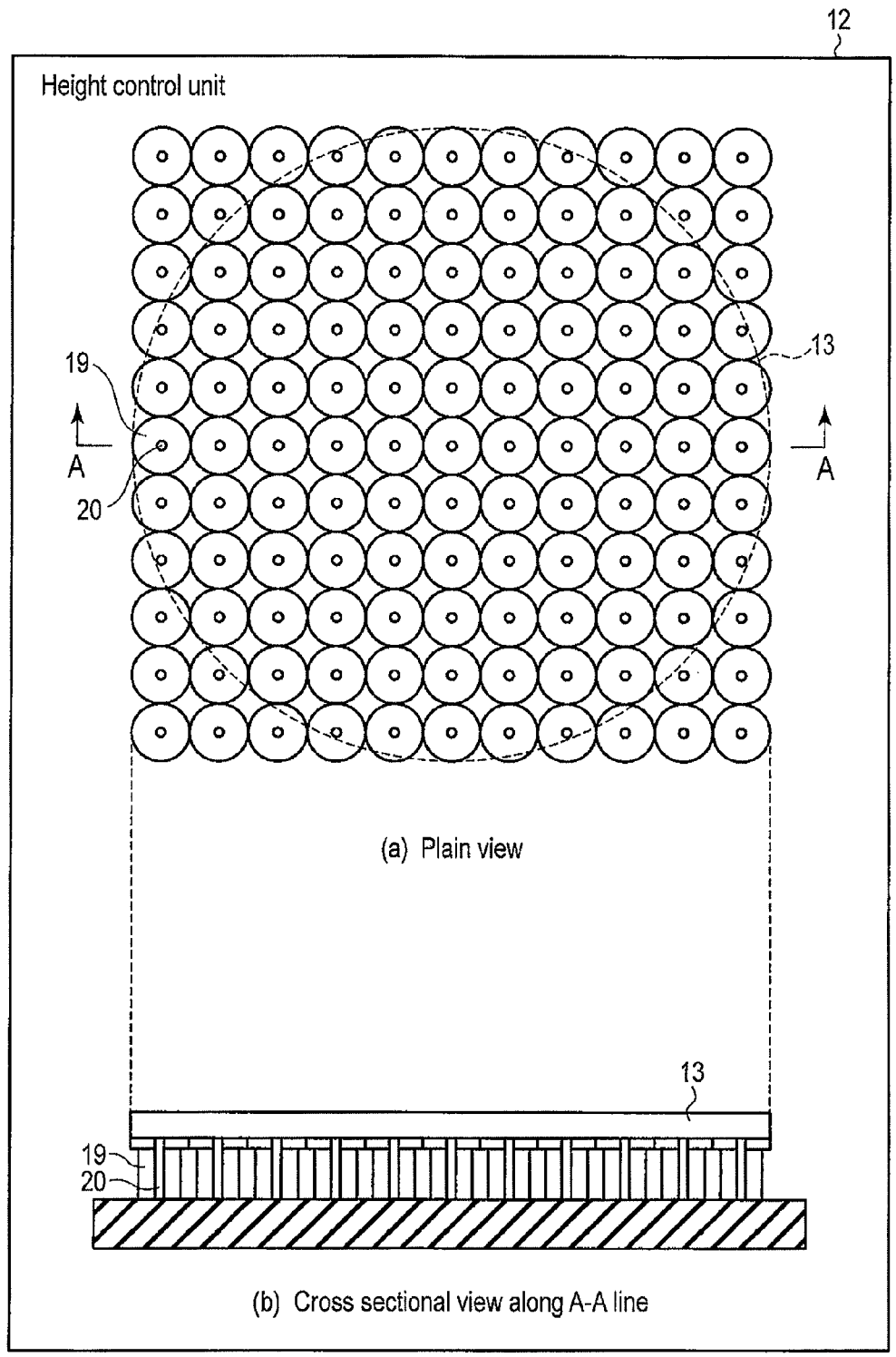
FIGS. 2 to 4 are views showing a height control unit.

In general, according to one embodiment, a stage apparatus comprising: a height control unit provided under a lower surface of a substrate, the height control unit comprising height control elements each which is drove in an upward/downward direction independently; a measuring unit which divides an upper surface of the substrate into areas, and measures a height of each of the areas; and a control unit which controls the height control unit and the measuring unit, wherein the control unit is configured to set the height of each of the areas independently by controlling a height of each of the height control elements based on a data value, determine using the measuring unit whether the height of each of the areas in the upper surface of the substrate is in a allowable range, and set the height of the area out of the allowable range again by the height control elements.

An embodiment will be explained below referring to the drawings.

1. Stage Apparatus

In conventional technologies, a function material layer is provided with a thickness distribution by forming irregularities on an upper surface of the function material layer formed on an upper surface of a substrate in a state that the upper surface of the substrate (substrate to be processed) is kept plain. In contrast, the embodiment proposes a technology which can provide a function material layer with a thickness distribution by a stage apparatus which can provide an upper surface of a substrate with irregularities without providing an upper surface of the function material with irregularities.

That is, the stage apparatus divides the upper surface of the substrate into areas and independently controls a height of each area. It is possible to provide the function material layer formed on the substrate with the thickness distribution by relatively changing a height of one of the areas with respect to a height of other one area.

Here, a type of the substrate is not limited. For example, the substrate may include a single-layer/multi-layer, an insulator/conductor/semiconductor, and the like and further may include a function element.

It is assumed that an upper surface of a substrate is an upper surface in an initial state in which nothing is formed on the upper surface of the substrate. When a function element such as a transistor and the like is formed on the upper surface of the substrate, irregularities may be formed on the function element. However, even in the case, it is assumed that when the substrate is provided on a plain stage apparatus, the upper surface of the substrate becomes plain.

An example of the stage apparatus will be explained below.

FIG. 1 shows the stage apparatus.

Height control unit 12 is disposed on stage 11. When an upper surface of substrate 13 is divided into areas, height control unit 12 has a function which independently controls a height of each area. Height control unit 12 may be integrated with stage 11 or they may be separable from each other. Further, stage 11 may be omitted.

As shown in, for example, FIG. 2, height control unit 12 is provided under a lower surface of substrate 13 and includes height control elements 19 which are independently driven in an upward/downward direction.

Here, a layout of height control elements 19 is not particularly limited. In the example, although height control elements 19 are provided in contact with each other in an array state, height control elements 19 may be separated from each other in place of the above configuration.

Figure 3:
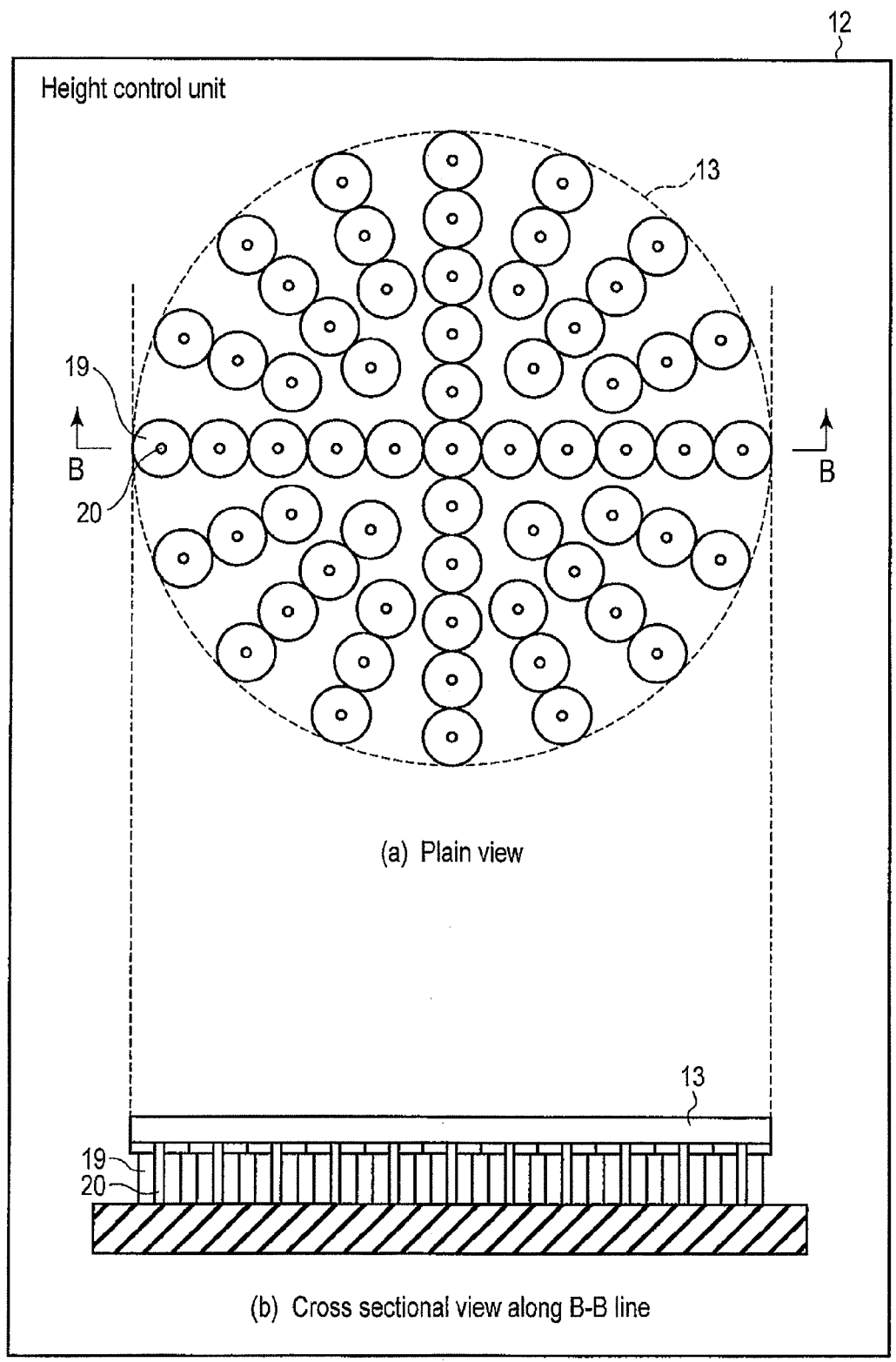

Further, as shown in FIG. 3, it is also possible to provide height control elements 19 so as to be point symmetry with respect to a center of height control unit 12.

However, it is desirable to uniformly provide height control elements 19 to realize a function which independently control a height in each area of the upper surface of substrate 13.

Further, in FIGS. 2 and 3, height control elements 19 have a chuck function which adsorbs the lower surface of substrate 13. That is, each of height control elements 19 has suction port 20 in a central portion which adsorbs the lower surface of substrate 13. When, for example, suction port 20 is connected to a vacuum pump, substrate 13 can be fixed by vacuum adsorption.

In the example, although all of height control elements 19 have the chuck function, when at least one of height control elements 19 has the chuck function, an object of fixing substrate 13 by adsorption can be achieved.

Further, height control elements 19 may not have the chuck function.

Figure 4:
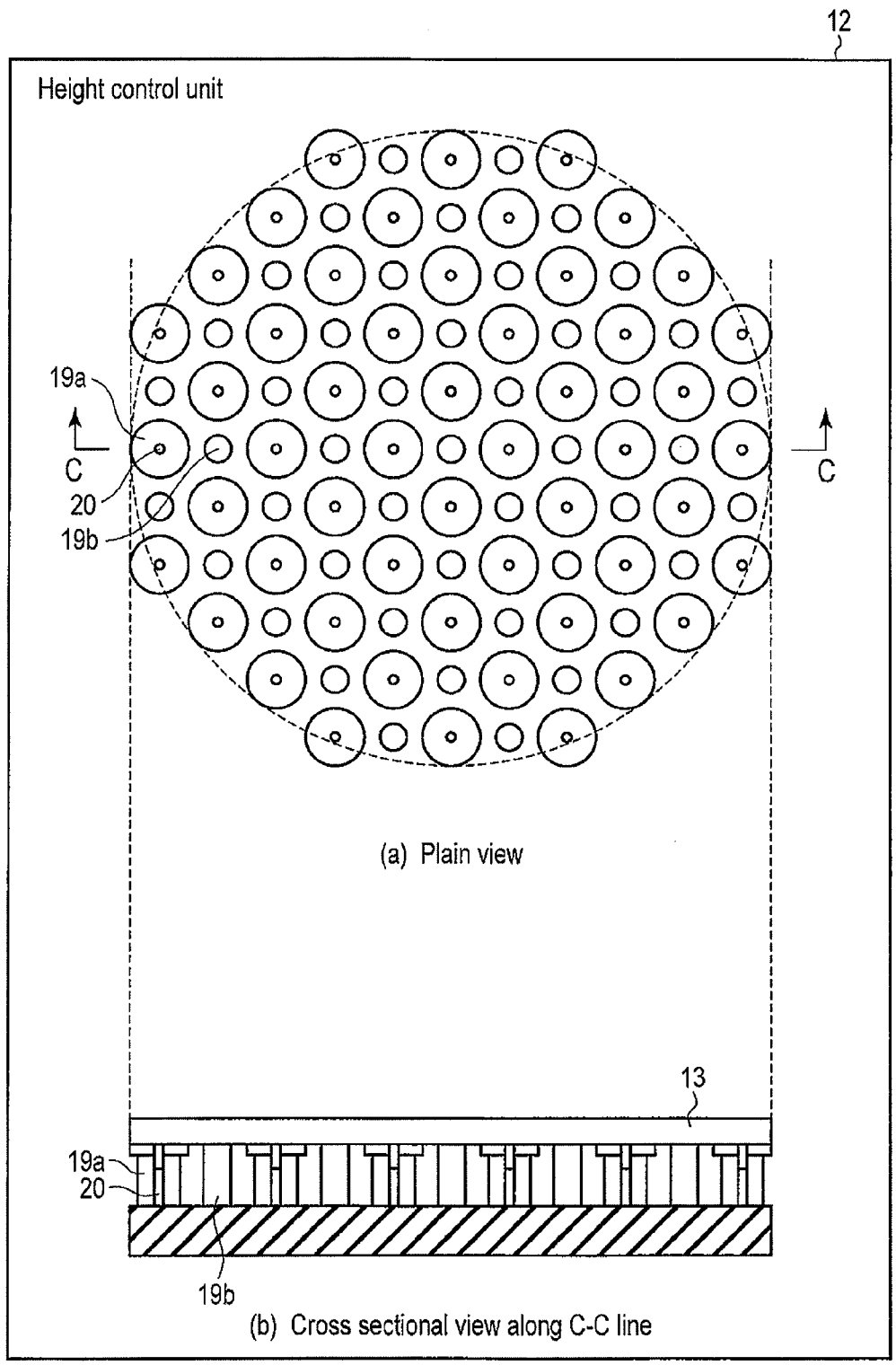

In the case, as shown in, for example, FIG. 4, height control unit 12 has chuck elements 19a which adsorb the lower surface of substrate 13 and height control elements 19b which independently control heights in the respective areas of the upper surface of substrate 13. Chuck elements 19a are provided between height control elements 19b.

Each of chuck elements 19a has suction port 20 in a central portion thereof which adsorbs the lower surface of substrate 13. Each of height control elements 19b controls the height of each area of the upper surface of substrate 13 by being driven independently in an upward/downward direction.

Figure 5:
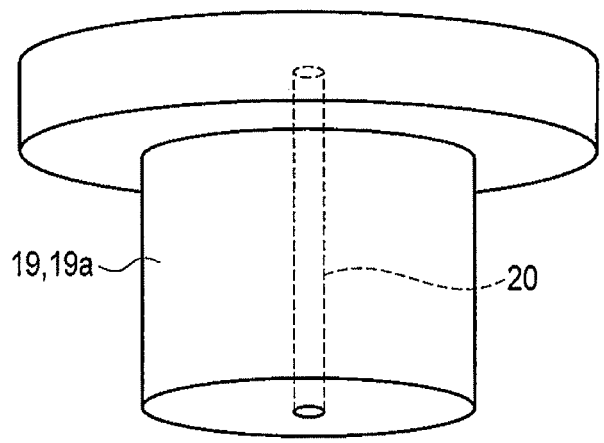
FIGS. 5 and 6 are views showing a height control element.

Here, one of height control elements 19 of FIGS. 2 and 3 or one of chuck elements 19a of FIG. 4 is shown in, for example, FIG. 5.

Figure 6:
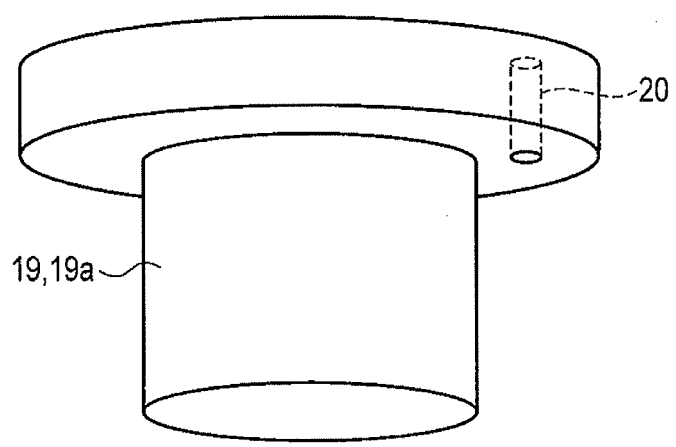

In the drawing, although suction port 20 is provided to the central portion of height control element 19 or the central portion chuck element 19a, it is also possible to provide suction port 20 to an end portion of height control elements 19 or to an end portion chuck elements 19a as shown in, for example, FIG. 6 in place of the above configuration.

Note that height control elements 19, 19b and chuck elements 19a can be composed of an insulation material such as ceramic and the like. Further, height control elements 19, 19b can be driven by a piezoelectric body such as a piezoelectric device and the like and a mechanism which can control a height of an adsorption surface of the substrate by a drive amount of a servo motor, a micrometer, and the like.

Measuring unit 14 is provided above height control unit 12.

Measuring unit 14 has a function which divides the upper surface of substrate 13 into the areas and measures a height of each area. The height of each area may be an absolute height based on a specific reference point or may be a relative height using a height of one of the areas as a reference.

Further, measuring unit 14 may have a function which measures characteristics of each area of the upper surface of substrate 13. In the case, just before the height of each area is independently controlled, a target value of the height of each area can be determined based on the characteristics of each area. This matter will be described in detail in an explanation of an operation of the stage apparatus.

Control unit 15 controls height control unit 12 and measuring unit 14.

A basic operation of control unit 15 is as described below.

First, control unit 15 controls a height of each of height control elements in height control unit 12 based on a data value, thereby independent setting the height of each area in the upper surface of substrate 13.

Note that the data value is stored in a memory in control unit 15 by, for example, a data transfer from other unit or by a data input job by a user.

Further, as described above, when measuring unit 14 has the function which measures the characteristics of each area, a measurement result by measuring unit 14 may be stored in the memory in control unit 15 as the data value.

Next, control unit 15 determines whether or not the height of each area in the upper surface of substrate 13 is in an allowable range using measuring unit 14. When the height of each area is in the allowable range, the operation of the stage apparatus is finished.

Figure 7:
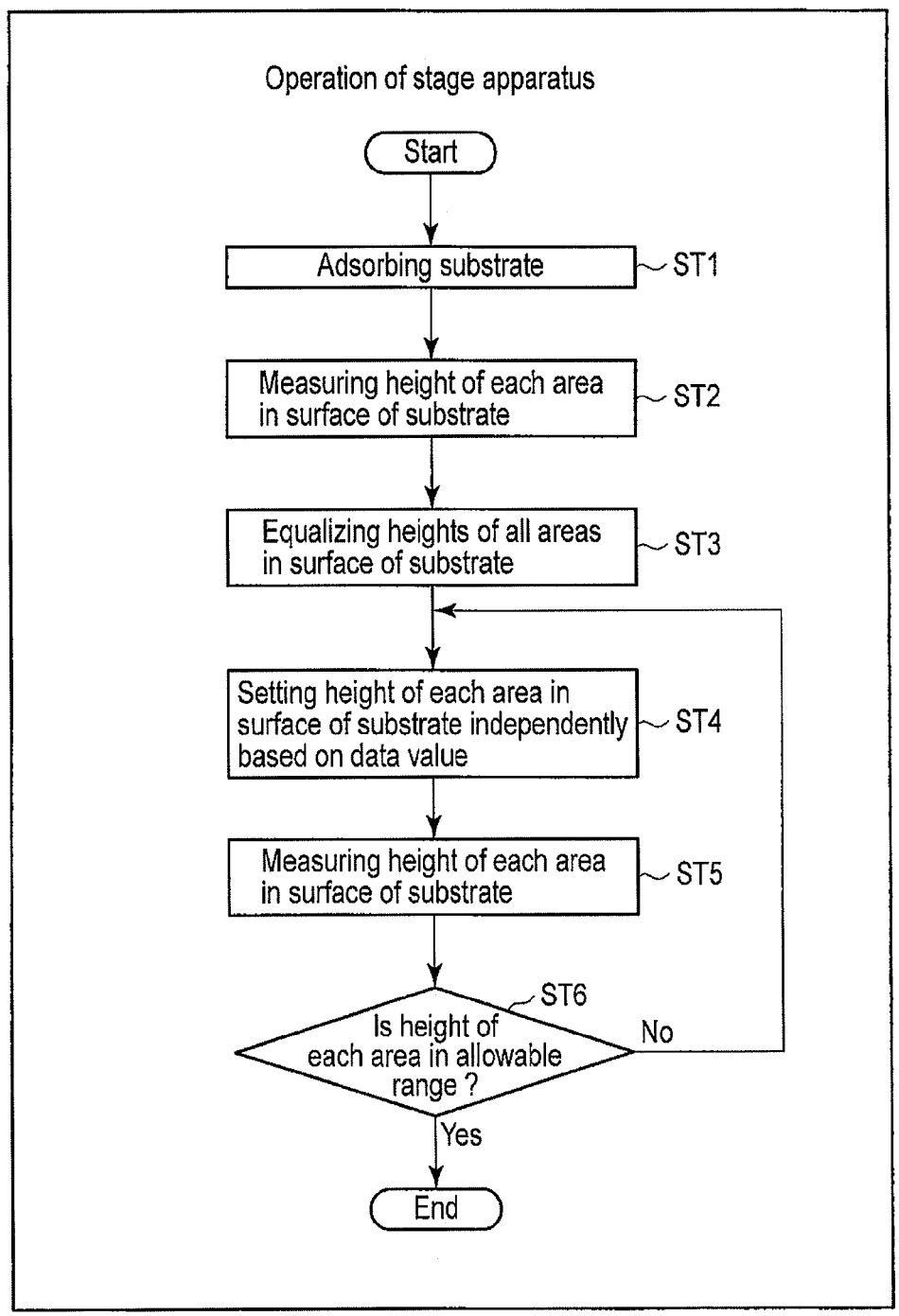

FIG. 7 shows a first example of the operation of the stage apparatus.

The operation of the stage apparatus is controlled by a control unit.

After the substrate is mounted on the height control unit, the operation of the stage apparatus is started. The substrate is transported by a transport unit. The stage apparatus may include or may not include the transport unit.

First, the substrate is fixed by, for example, the vacuum adsorption (step ST1). Next, a height of each area in the upper surface of the substrate is measured (step ST2). When the heights of all the areas in the upper surface of the substrate are not equal to each other, the heights of all the areas in the upper surface of the substrate are made equal to each other (step ST3).

Thereafter, the height of each area in the upper surface of the substrate is independently set based on the data value (step ST4). The height of each area is measured and whether or not the height of each area is in the allowable range is determined (steps ST5-ST6).

When the height of each area is in the allowable range, the operation of the stage apparatus is finished, whereas when the height of each area is not in the allowable range, the height of each area in the upper surface of the substrate is independently set based on the data value (step ST4).

By the operation, the height of each area in the upper surface of the substrate can be controlled highly accurately as well as in a short time. Accordingly, when, for example, the function material layer is formed on the substrate, the function material layer can be provided with the thickness distribution by making an upper surface of the function material layer plain.

FIG. 8 shows a second example of the operation of the stage apparatus.

In comparison with the first example, the second example has a feature in an operation which sets the height of each area on the substrate in the allowable range.

The operation of the stage apparatus is controlled by the control unit.

After the substrate is mounted on the height control unit, the operation of the stage apparatus is started. The substrate is transported by a transport unit likewise the first example.

First, the substrate is fixed by, for example, the vacuum adsorption (step ST1). Next, the height of each area in the upper surface of the substrate is measured (step ST2). When the heights of all the areas in the upper surface of the substrate are not equal to each other, the heights of all the areas in the upper surface of the substrate are made equal to each other (step ST3).

Thereafter, the height of each area in the upper surface of the substrate is independently set based on the data value (step ST4). The height of each area is measured and whether or not the height of each area is in the allowable range is determined (steps ST5-ST6).

When the height of each area is in the allowable range, the operation of the stage apparatus is finished, whereas when the height of each area is not in the allowable range, heights of areas which are outside of the allowable range are set again based on the data value set (step ST7).

That is, according to the example, since only the heights of the areas which are outside of the allowable range are set again without setting again the heights of all the areas, a time necessary to set the height of each area can be reduced.

Further, in a routine from step ST7 to steps ST5-ST6, it is also possible to omit steps ST5-ST6 to the areas in the allowable range.

By the operation, the height of each area in the upper surface of the substrate can be controlled highly accurately as well as in a short time. Accordingly, when for example, the function material layer is formed on the substrate, the function material layer can be provided with the thickness distribution by making an upper surface of the function material layer plain.

FIG. 9 shows a third example of the operation of the stage apparatus.

In comparison with the first example, the third example has a feature in an operation which measures characteristics of each area on a substrate just before a height of each area is set.

The operation of the stage apparatus is controlled by a control unit.

After the substrate is mounted on the height control unit, the operation of the stage apparatus is started. The substrate is transported by the transport unit likewise the first example.

First, the substrate is fixed by, for example, the vacuum adsorption (step ST1). Next, the height of each area in the upper surface of the substrate is measured (step ST2). When the heights of all the areas in the upper surface of the substrate are not equal to each other, the heights of all the areas in the upper surface of the substrate are made equal to each other (step ST3).

Thereafter, characteristics of each area in an upper surface of substrate are measured. Further, a target value of the height of each area is determined based on the characteristics of each area. The target value is stored in the memory in the control unit as the data value (step ST3').

Next, the height of each area in the upper surface of the substrate is independently set based on the data value (step ST4). The height of each area is measured and whether or not the height of each area is in the allowable range is determined (steps ST5-ST6).

When the height of each area is in the allowable range, the operation of the stage apparatus is finished, whereas when the height of each area is not in the allowable range, the height of each area in the upper surface of the substrate is independently set again based on the data value (step ST4).

By the operation, the height of each area in the upper surface of the substrate can be controlled highly accurately as well as in a short time. Accordingly, when, for example, the function material layer is formed on the substrate, the function material layer can be provided with the thickness distribution by making an upper surface of the function material layer plain.

FIG. 10 shows a calibration operation.

The calibration is a job which obtains a relation between a drive amount of a height control element by the data value (a change amount of a height of a substrate adsorption surface) and an actual height of each area of the upper surface of the substrate by a measurement (a change amount the height of each area) and corrects the drive amount of the height control element by the data value.

First, the height of each area in the upper surface of the substrate is measured (step ST1).

Next, after the height of each area is changed based on the data value, the height of each area is measured again (steps ST2-ST3).

Then, a relation between the data value and the actual height of each area is obtained (step ST4).

For example, a case that a target value of a height of a specific area is determined to x (data value) based on characteristics of the specific area will be examined.

In the case, first, the drive amount of the height control element is set to x based on the data value x, and the height control element is driven. Thereafter, an actual height of the specific area is measured. Then, when the actual height of the specific area is x+Δ, the drive amount of the height control element is corrected to x−Δ, and the height control element is driven again. Further, when the actual height of the specific area x−Δ, the drive amount of the height control element is corrected to x+Δ, and the height control element is driven again.

In the example, it is found that a difference ±Δ exists between the data value and the actual height. That is, since it is possible to obtain the relation between the data value and the actual height, the drive amount (data value) of the height control element can be corrected.

Accordingly, when same products are manufactured in bulk, and the like, the data value can be previously set to x±Δ by obtaining the difference ±Δ. With the operation, since the height of each area in the upper surface of the substrate can be accommodated in the allowable range at an early stage, a process can be executed at a high speed.

Further, when different products are manufactured, and the like, the calibration may be executed by obtaining the difference ±Δ of each product.

2. Process Apparatus

The process apparatus is an apparatus which is used in a step of a manufacturing process of electronic devices such as a semiconductor device, an organic device, an inorganic device, and the like. The process apparatus includes, for example, a coating apparatus, an exposure apparatus, an etching apparatus, a film forming apparatus, an ion implantation apparatus, and the like.

Figure 11:
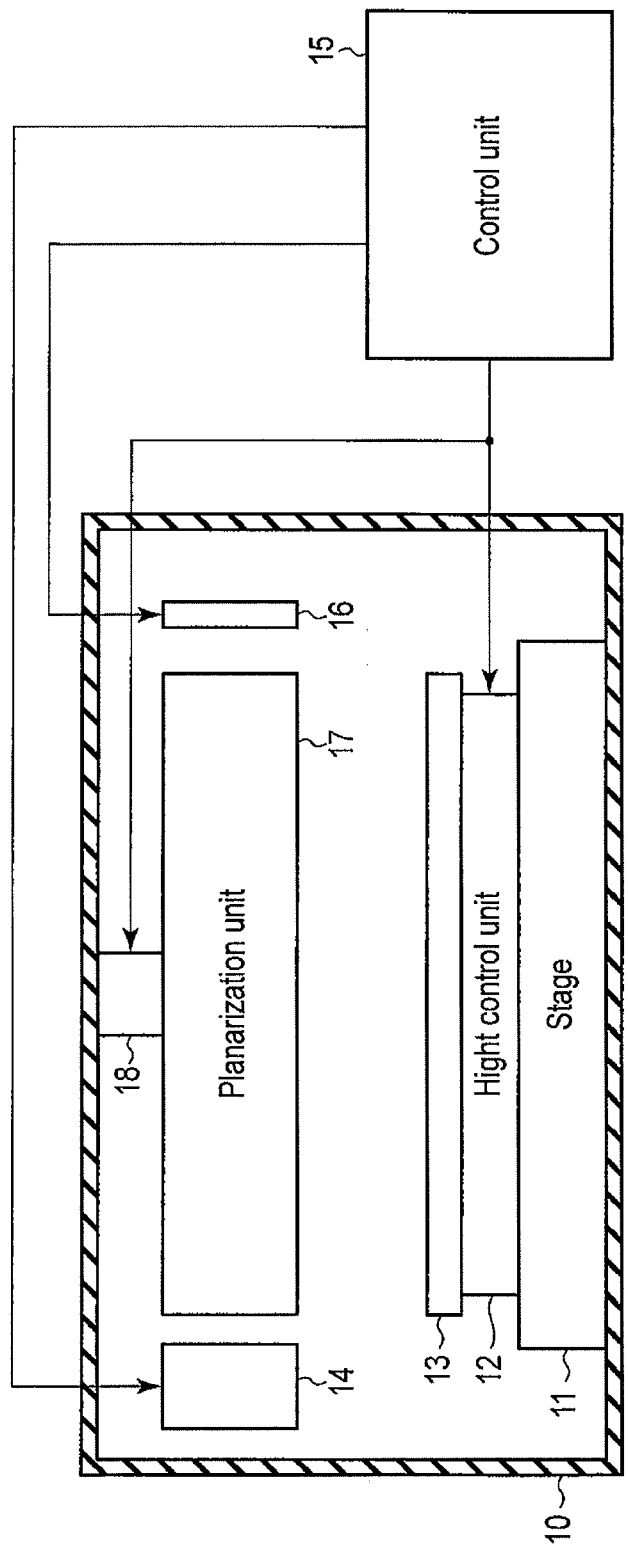
FIG. 11 is a view showing a process apparatus.
Figure 15:
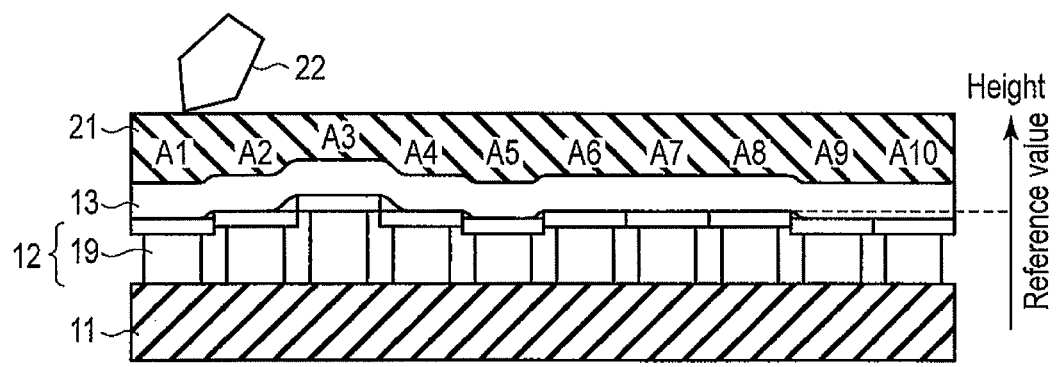

FIG. 11 shows an example of the process apparatus using the stage apparatus of FIG. 1.

Stage 11, height control unit 12, and measuring unit 14 are one of components of the stage apparatus of FIG. 1, respectively. Since they are already explained in the explanation of the stage apparatus in detail, an explanation thereof is omitted here.

Substrate (substrate to be processed) 13 is provided on height control unit 12.

Material supply unit 16 which forms a function material layer on an upper surface of substrate 13 is provided above height control unit 12.

After control unit 15 independently sets a height of each area in the upper surface of substrate 13, control unit 15 forms the function material layer on the upper surface of substrate 13 using material supply unit 16 on a condition that the height of each area is in an allowable range.

Planarization unit 17 is provided for a purpose of planarizing an upper surface of the function material layer formed on substrate 13. A type of the planarization unit is not particularly limited. Planarization unit 17 may be, for example, a planarization plate having a plain surface (lower surface) or may be a mechanism which planarizes the upper surface of the function material layer using a member such as a squeeze.

Note that planarization unit 17 may be omitted. This is because the upper surface of function material layer may be sufficiently planarized without using the planarization unit.

The upper surface of the function material layer can be planarized using technologies of, for example, a spin coating, a spray coating, a bar coating, a meniscus coating, a capillary coating, an inkjet, a dispenser, and the like.

Further, when the function material layer has fluidity, the upper surface of function material layer can be also planarized making use of the fluidity after the function material layer is formed without using these technologies.

Note that the upper surface of function material layer may be planarized by combining the technologies or the methods described above.

The upper surface of the function material layer may be planarized by, for example, pressing the planarization plate onto the upper surface of the function material layer after the function material layer is formed by the inkjet method.

Further, when the function material layer is a photoresist layer, it is preferable to planarize an upper surface of the photoresist layer using the planarization plate such as quartz and the like. This is because when a material such as the quartz and the like which permits ultraviolet rays to pass therethrough is employed as the planarization plate, the photoresist layer can be exposed and cured at the same time the upper surface of the photoresist layer is planarized.

When the function material layer is further of a thermosetting type at the time the upper surface of the function material layer is planarized using the planarization plate, the upper surface of the function material layer can be planarized and cured simultaneously by heating the planarization plate.

Drive unit 18 drives planarization unit 17 in the upward/downward direction under a control by, for example, control unit 15.

Then, substrate stage 11, height control unit 12, measuring unit 14, material supply unit 16, and planarization unit 17 are provided in chamber 10.

An example of a process which forms a function material layer having thickness distribution on a substrate using the process apparatus of FIG. 11 will be explained below.

FIGS. 12 to 15 show the process which forms the function material layer.

First, as shown in FIG. 12, heights of height control elements 19 in height control unit 12 (for example, heights of substrate adsorption surfaces) are caused to agree with a reference value. That is, heights of areas A1-A10 in the upper surface of substrate 13 are made equal to each other.

Next, as shown in FIG. 13, the respective heights of height control elements 19 are controlled based on a data value, thereby independently setting the heights of areas A1-A10 in the upper surface of substrate 13.

Next, as shown in FIG. 14, function material layer 21 is formed on substrate 13. Further, an upper surface of function material layer 21 is planarized by a planarization unit (for example, a planarization plate such as quartz, silicon, and the like). As shown in, for example, FIG. 15, the upper surface of function material layer 21 may be planarized by squeeze 22.

With the process described above, function material layer 21 having the thickness distribution can be formed on substrate 13.

As described above, it is possible to provide the function material layer with the thickness distribution by relatively changing the heights of the respective areas on the substrate as well as planarizing the upper surface of the function material layer without providing irregularities on the upper surface of function material layer. That is, since an extra time is not consumed to control the thickness of function material layer, the processing process can be shortened.

Further, since the thickness distribution of the function material layer can be controlled highly accurately, it is also possible to improve a performance of an electronic device realized by the function material layer. Further, a manufacturing period of an electronic device can be also shortened by shortening the processing process.

Accordingly, various types of electronic devices can be manufactured with a good yield as well as a manufacturing cost can be reduced and a shipment time can be expedited.

Figure 16:
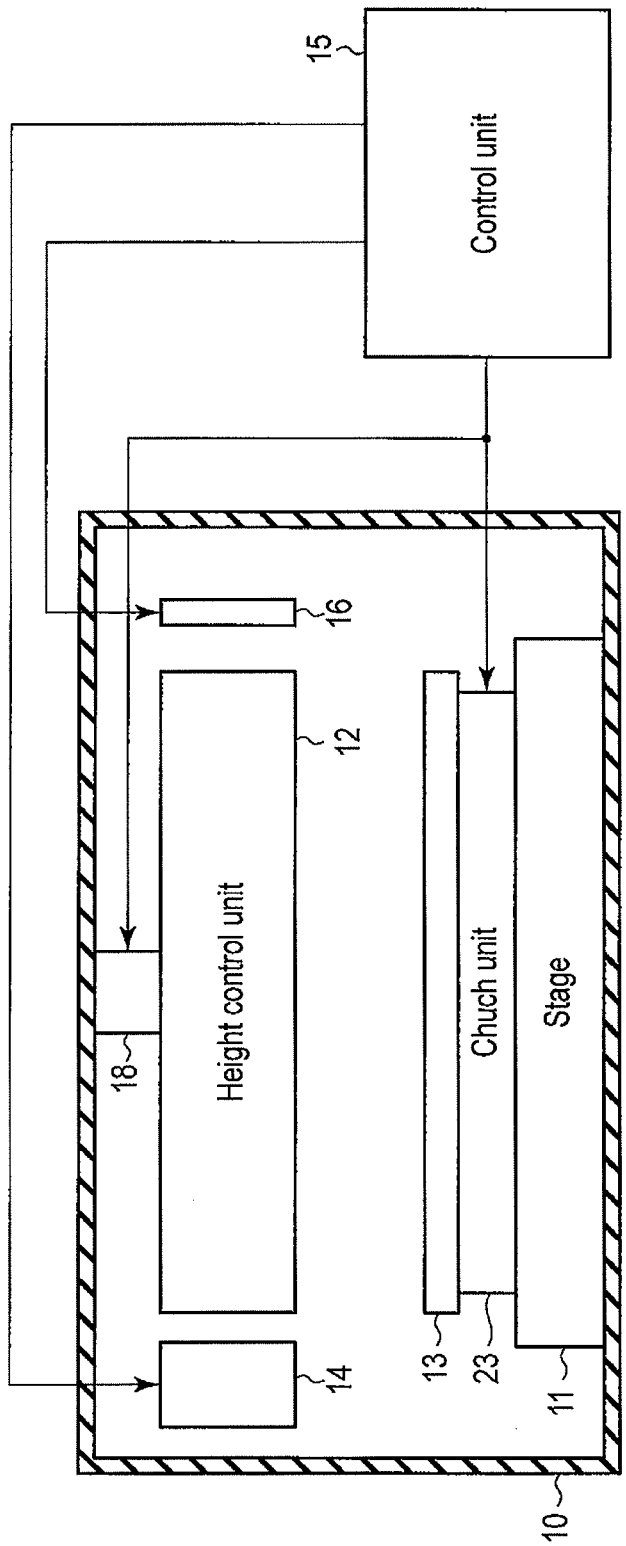
FIG. 16 is a view showing a process apparatus.

FIG. 16 shows other example of the process apparatus.

The process apparatus does not use the stage apparatus of FIG. 1, the stage apparatus of FIG. 1 is applied to the process apparatus. A feature of the process apparatus resides in that height control unit 12 is provided above a substrate (substrate to be processed) instead of being provided under the substrate.

Chuck unit 23 is provided on stage 11. Chuck unit 23 has a function which fixes a lower surface of substrate 13 by adsorption.

Height control unit 12 is provided above an upper surface of substrate 13 and includes height control elements which are independent drive in the upward/downward direction. Height control unit 12 is driven by drive unit 18 in the upward/downward direction in its entirety. Further, each of the height control elements in height control unit 12 is independently driven by drive unit 18 in the upward/downward direction.

Material supply unit 16 is provided for a purpose of forming a function material layer on the upper surface of substrate 13. For example, material supply unit 16 coats a functions material on the upper surface of substrate 13.

Measuring unit 14 has a function which measures characteristics of each area on the upper surface of substrate 13.

That is, in the example, measuring unit 14 is provided for a purpose of determining a target value of a height (thickness) of the function material layer of each area based on the characteristics of each area just before a height of the height control elements is independently set.

Accordingly, when the characteristics of each area are previously obtained by other means, measuring unit 14 may be omitted. In the case, the target value of the height of the function material layer of each area is stored in the memory in control unit 15 by, for example, the data transfer from other unit or the data input job by the user.

Note that measuring unit 14 may have a function which measures the height of the function material layer in each area on substrate 13.

Control unit 15 controls chuck unit 23, drive unit 18 of height control unit 12, measuring unit 14, and material supply unit 16.

When the upper surface of substrate 13 is divided into areas, control unit 15 controls a height of an upper surface of the function material layer of each area formed on substrate 13. That is, control unit 15 controls each height of the height control elements based on the data value and adds irregularities onto the upper surface of function material layer by pressing the height control elements to the upper surface of function material.

The height control elements in height control unit 12 have a structure as shown in, for example, FIGS. 2 to 6. Since the height control elements are already explained in FIGS. 2 to 6, a detailed description here is omitted.

When height control unit 12 of the example is compared with height control unit 12 in the process apparatus of, for example, FIG. 11, height control unit 12 of the example has a feature in that a direction in the upward/downward direction is inverted each other.

Note that the height control elements may be covered with a protection layer. In the case, the height control elements are pressed to the upper surface of the function material layer on substrate 13 via the protection layer. This will be described in detail as an example of a process which forms the function material layer.

An example of a process which forms a function material layer having a thickness distribution on a substrate using a process' apparatus of FIG. 16 will be explained below.

FIGS. 17 to 19 show an example of the process which forms the function material layer.

First, as shown in FIG. 17, heights of height control elements 19 in height control unit 12 are caused to agree with a reference value. That is, the heights of height control elements 19 corresponding to areas A1-A10 on substrate 13 are made equal to each other.

Further, function material layer 21 is formed on substrate 13 in a state that substrate 13 is fixed by chuck unit 23.

Next, as shown in FIG. 18, the respective heights of height control elements 19 are independently controlled based on a data value. Thereafter, height control elements 19 are pressed to an upper surface of function material layer 21. In the state, function material layer 21 is cured.

Then, when height control elements 19 are exfoliated from the upper surface of function material layer 21, as shown in FIG. 19, function material layer 21 having a thickness set independently is formed to each of areas A1-A10.

Note that when function material layer 21 has low fluidity, function material layer 21 may be cured after height control elements 19 are exfoliated from the upper surface of function material layer 21.

With the process described above, function material layer 21 having the thickness distribution can be formed on substrate 13.

FIGS. 20 to 22 show other example of the process which forms the function material layer.

The example relates to a process when height control elements 19 are covered with a protection layer (for example, protection film) 24. It may be not desirable for height control elements 19 to come into direct contact with function material layer 21.

Thus, protection layer 24 is provided so that height control elements 19 do not come into contact with function material layer 21. Protection layer 24 is composed of, for example, a fluororesin, a ceramic material, and the like. It is assumed that protection layer 24 has flexibility and a sufficient strength so that protection layer 24 is not broken by an operation of height control elements 19 in the upward/downward direction.

Further, when protection layer 24 is provided, an effect that irregularities on an upper surface of function material layer 21 are smoothly changed can be incidentally obtained.

First, as shown in FIG. 20, heights of height control elements 19 in height control unit 12 are caused to agree with a reference value. That is, the heights of height control elements 19 corresponding to areas A1-A10 on substrate 13 are made equal to each other.

Further, function material layer 21 is formed on substrate 13 in a state that substrate 13 is fixed by chuck unit 23.

Next, as shown in FIG. 21, the respective heights of height control elements 19 are independently controlled based on a data value. At the time, protection layer 24 is deformed following a change of the heights of height control elements 19. Thereafter, height control elements 19 are pressed to the upper surface of function material layer 21 via protection layer 24. In the state, function material layer 21 is cured.

Then, when height control elements 19 are exfoliated from the upper surface of function material layer 21, as shown in FIG. 22, function material layer 21 having a thickness set independently is formed to each of areas A1-A10.

Note that when function material layer 21 has low fluidity, function material layer 21 may be cured after height control elements 19 are exfoliated from the upper surface of function material layer 21.

With the process described above, function material layer 21 having the thickness distribution can be formed on substrate 13.

3. Applied Example

The stage apparatus and the process apparatus described above can be applied to, for example, an exposure apparatus.

In the exposure apparatus, for example, the stage apparatus of FIG. 1 can be used to adjust a degree of flatness of a substrate acting as a subject to be exposed.

For example, after a photoresist layer is formed on an upper surface of a substrate, the substrate having the photoresist layer is carried into the exposure apparatus and fixed on a stage apparatus. At the time, there is a case that a height of the upper surface of the substrate on a stage is not constant:

A warp is generated to a substrate because the substrate passes through various processes;

A case that a dispersion occurs to a thickness of a photoresist layer; and

A case that irregularities are generated to a base layer of a photoresist layer.

In these cases, when exposure is executed without correcting the height of the upper surface of the substrate, exposure accuracy is degraded due to an exposure focus error. Accordingly, when the height of the upper surface of the substrate is made constant using, for example, the stage apparatus of FIG. 1, since the exposure focus error is almost eliminated, a highly accurate exposure can be executed.

Note that, also in a process apparatus other than the exposure apparatus, it is very effective to use the stage apparatus and the process apparatus explained in the embodiment to achieve an object of the apparatus (for example, an improvement of an etching accuracy in an etching apparatus).

4. Others

In the embodiment described above, although the measuring unit has the function which measures characteristics, a height, and the like of each area on a substrate, the measuring unit may further have a function which measures the following items in response to a function of an electronic device to be produced as characteristics for measuring each area:

Physical amounts such as a thickness, a density, and the like of a function material layer;

Transmittance, reflectance, refractive index, and the like of a function material layer with respect to light having a predetermined wavelength;

In a light emitting device, optical characteristic amounts such as a wavelength and the like of generated light; and Electric/magnetic characteristic amounts such as an electric conductance, a resistance value, a capacitance, a magnetic susceptibility, and the like of a function material layer.

5. Conclusion

According to the embodiment, a thickness distribution of a function material layer can be controlled highly accurately as well as in a short time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A process apparatus comprising:
a height control unit provided under a lower surface of a substrate, the height control unit comprising height control elements each of which is driven in an upward/downward direction independently;
a measuring unit which divides an upper surface of the substrate into areas, and measures a height of each of the areas;
a control unit which controls the height control unit and the measuring unit; and
a material supplying unit which forms a functional material layer on the upper surface of the substrate,
wherein the control unit is configured to set the height of each of the areas independently by controlling a height of each of the height control elements based on a data value, determine using the measuring unit whether the height of each of the areas in the upper surface of the substrate is in an allowable range, and set the height of the area that is out of the allowable range again by the height control elements, and
the control unit is configured to form the functional material layer on the upper surface of the substrate using the material supplying unit.

2. The apparatus of claim 1,
wherein the control unit is configured to set the height of each area, after equalizing the heights of all of the areas in the upper surface of the substrate.

3. The apparatus of claim 1,
wherein the control unit is configured to store a target value of the height of each area as the data value preliminarily by measuring characteristics of each area by the measuring unit, before setting the height of each area in the upper surface of the substrate.

4. The apparatus of claim 1,
wherein the control unit is configured to correct a variation of the height of each of the height control elements by obtaining a relationship between the data value and a variation of a real height of each area.

5. The apparatus of claim 1,
wherein at least one of the height control elements comprises a chuck function which adsorbs the lower surface of the substrate.

6. The apparatus of claim 1,
wherein the height control unit comprises chuck elements each which adsorbs the lower surface of the substrate, wherein the chuck elements are provided between the height control elements.

7. A process apparatus comprising:
a height control unit provided under a lower surface of a substrate, the height control unit comprising height control elements each of which is driven in an upward/downward direction independently; and
a control unit which controls the height control unit; and
a material supplying unit which forms a functional material layer on the upper surface of the substrate,
wherein the control unit is configured to divide an upper surface of the substrate into areas, and set the height of each of the areas independently by controlling a height of each of the height control elements based on a data value, and
the control unit is configured to form the functional material layer on the upper surface of the substrate using the material supplying unit.

8. The apparatus of claim 7,
further comprising a measuring unit which measures a height of each of the areas in the upper surface of the substrate,
wherein the control unit is configured to determine using the measuring unit whether the height of each of the areas in the upper surface of the substrate is in an allowable range.

9. The apparatus of claim 8,
wherein the control unit is configured to set the height of the area that is out of the allowable range again by the height control elements.

10. The apparatus of claim 7,
wherein the control unit is configured to set the height of each area, after equalizing the heights of all of the areas in the upper surface of the substrate.

11. The apparatus of claim 8,
wherein the control unit is configured to store a target value of the height of each area as the data value preliminarily by measuring characteristics of each area by the measuring unit, before setting the height of each area in the upper surface of the substrate.

12. The apparatus of claim 7,
wherein the control unit is configured to correct a variation of the height of each of the height control elements by obtaining a relationship between the data value and a variation of a real height of each area.

13. The apparatus of claim 7,
wherein at least one of the height control elements comprises a chuck function which adsorbs the lower surface of the substrate.

14. The apparatus of claim 7,
wherein the height control unit comprises chuck elements each of which adsorbs the lower surface of the substrate, wherein the chuck elements are provided between the height control elements.

15. A process apparatus comprising:
a chuck unit which adsorbs a lower surface of a substrate;
a height control unit provided above an upper surface of the substrate, the height control unit comprising height control elements each of which is driven in an upward/downward direction independently;
a material supplying unit which forms a functional material layer on the upper surface of the substrate; and
a control unit which controls the chuck unit, the height control unit and the material supplying unit,
wherein the control unit is configured to form the functional material layer on the upper surface of the substrate using the material supplying unit, control a height of each of the height control elements based on a data value, and press the height control elements to the upper surface of the functional material layer.

16. The apparatus of claim 15,
wherein the height control elements are covered with a protection layer, and press to the upper surface of the functional material layer through the protection layer.

17. The apparatus of claim 15,
wherein the control unit is configured to set the height of each height control element, after equalizing the heights of all of the height control elements.

18. The apparatus of claim 15,
wherein the control unit is configured to store a target value of the height of each height control element as the data value preliminarily by measuring characteristics of areas in the upper surface of the substrate, before setting the height of each height control element.

* * * * *

UNITED STATES PATENT AND TRADEMARK OFFICE
CERTIFICATE OF CORRECTION

| | | |
|---|---|---|
| PATENT NO. | : 9,021,983 B2 | Page 1 of 1 |
| APPLICATION NO. | : 13/428530 | |
| DATED | : May 5, 2015 | |
| INVENTOR(S) | : Inanami et al. | |

It is certified that error appears in the above-identified patent and that said Letters Patent is hereby corrected as shown below:

In the claims

Claim 7, column 11, line 64, change "downward direction independently and" to --downward direction independently--.

Signed and Sealed this
Twenty-seventh Day of October, 2015

Michelle K. Lee
*Director of the United States Patent and Trademark Office*